United States Patent
Oda

(10) Patent No.: US 7,336,306 B2
(45) Date of Patent: Feb. 26, 2008

(54) SOLID-STATE IMAGE SENSOR EFFICIENTLY UTILIZING ITS DYNAMIC RANGE AND IMAGE PICKUP APPARATUS USING THE SAME

(75) Inventor: Kazuya Oda, Asaka (JP)

(73) Assignee: FUJIFILM Corporation, Tokyo (JP)

( * ) Notice: Subject to any disclaimer, the term of this patent is extended or adjusted under 35 U.S.C. 154(b) by 664 days.

(21) Appl. No.: 10/303,788

(22) Filed: Nov. 26, 2002

(65) Prior Publication Data
US 2003/0098917 A1    May 29, 2003

(30) Foreign Application Priority Data
Nov. 26, 2001    (JP) ............... 2001-359726

(51) Int. Cl.
*H04N 3/14*    (2006.01)
(52) U.S. Cl. .................. 348/272; 348/283; 348/312; 348/319; 348/315
(58) Field of Classification Search ............ 348/282, 348/319, 312, 272, 283, 273
See application file for complete search history.

(56) References Cited
U.S. PATENT DOCUMENTS

| | | | | |
|---|---|---|---|---|
| 4,602,289 A | * | 7/1986 | Sekine | ............ 348/315 |
| 5,526,048 A | * | 6/1996 | Yamamoto | ............ 348/223.1 |
| 5,748,236 A | * | 5/1998 | Shibazaki | ............ 348/270 |
| 6,496,224 B2 | * | 12/2002 | Ueno | ............ 348/322 |
| 6,573,935 B1 | | 6/2003 | Yamada et al. | |
| 6,750,911 B1 | * | 6/2004 | Kobayashi et al. | ......... 348/273 |
| 6,873,360 B1 | * | 3/2005 | Kawashiri | ............ 348/296 |

FOREIGN PATENT DOCUMENTS

| | | | |
|---|---|---|---|
| JP | 01-151891 | * | 6/1989 |
| JP | 11-331855 | | 11/1999 |
| JP | 2000-350222 | * | 12/2000 |
| JP | 2001-078209 | | 3/2001 |

* cited by examiner

*Primary Examiner*—Tuan Ho
*Assistant Examiner*—Anthony J Daniels
(74) *Attorney, Agent, or Firm*—Birch, Stewart, Kolasch & Birch, LLP

(57) ABSTRACT

A solid-state image sensor includes photodiodes, which constitute pixels, shifted in position from each other and red (R), green (G) and blue (B) filter segments fitted on the photodiodes in a preselected pattern. R transfer gates, G transfer gates and B transfer gates each are connected to a particular vertical transfer electrode. Particular vertical drive pulses are fed to the electrodes to drive the transfer R, G and B transfer gates. Photodiode read pulses are applied to each of the electrodes at a particular timing on the basis of image signals output from the image sensor. Consequently, a signal charge generated in each photodiode is shifted to a particular vertical transfer path via the R, G or B transfer gate in accordance with color-by-color exposure time.

19 Claims, 6 Drawing Sheets

Fig. 5

|   | 3200K | 6000K | 10000K |
|---|---|---|---|
| R | 1.5~1.8 | 0.7 | 0.3~0.4 |
| G | 1 | 1 | 1 |
| B | 0.3~0.4 | 0.7 | 1.5~1.8 |

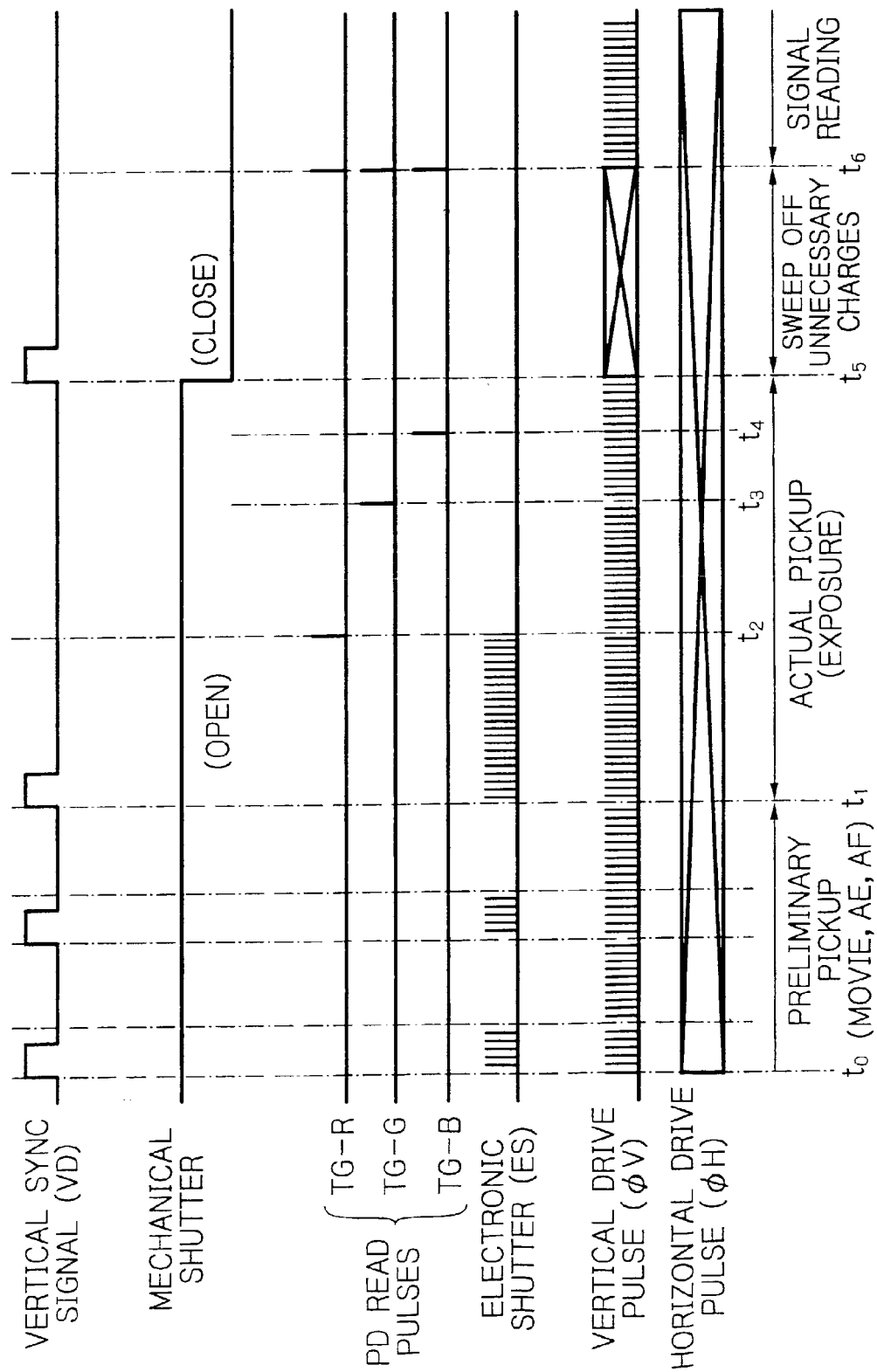

SOLID-STATE IMAGE SENSOR EFFICIENTLY UTILIZING ITS DYNAMIC RANGE AND IMAGE PICKUP APPARATUS USING THE SAME

BACKGROUND OF THE INVENTION

1. Field of the Invention

The present invention relates to a solid-state image sensor for outputting electric signals corresponding to amounts of light incident thereto and an image pickup apparatus using the same. More particularly, the present invention relates to a solid-state image sensor with a color filter fitted thereon.

2. Description of the Background Art

Today, a digital camera of the type using a solid-state image sensor configured to transform an optical image captured from a scene to electric image signals representative of the image is extensively used as an image pickup apparatus. This type of camera includes a digital signal processing circuit for processing digital image signals converted from the electric image signals. The digital image signals are subjected to various kinds of correction and then stored into a memory card or similar storage mounted on the camera.

The image sensor is implemented as, e.g. a single CCD (Charge Coupled Device) or CMOS (Complementary Metal Oxide Semiconductor) image sensor. An R (red), G (green) and B (blue) color filter is fitted on the photosensitive cell array of the image sensor and has R, G and B filter segments arranged in a Bayer or stripe pattern by way of example. With such a primary-color filter, the image sensor dot-sequentially outputs R, G and B image signals on a pixel-by-pixel basis depending upon the color pattern of the filter.

Generally, the digital camera is operated to pick up scenes illuminated under various kinds of light sources. The light sources include sunlight and artificial light sources including a flashbulb, a tungsten lamp, a fluorescent lamp and a mercury lamp. Further, the intensity of sunlight changes from the morning to the evening, from fine weather to cloudy or rainy weather, and from sunshine to shade. Before a shot, exposure adequate for a scene illuminated with any one of such light sources is determined in terms of an iris opening and a shutter speed. However, the problem with the camera is that the color balance of an image picked up is dependent on the color temperature of the light source used and other pickup conditions. With photosensitive film cameras, a traditional measure for coping with the difference in the kind of a light source is to use a color film matching with the color temperature of a light source or a color filter for adjusting color balance. By contrast, the digital camera of the type outputting electric image signals can process the image signals to adjust the white balance of image signals.

It has been customary with the digital camera to compensate for differences in sensitivity between the R, G and B color components ascribable to the color temperature of a light source by utilizing the nature of the dynamic range of the image sensor. More specifically, the R, G and B filter segments of the color filter are different in spectral transmission characteristic and therefore in transmissivity for incident light of a particular color component, resulting in differences in sensitivity between the pixels of different colors of the image sensor.

In practice, the digital camera is constructed to measure the lightness of a desired scene, evaluate an exposure time that does not bring about overexposure, and then execute automatic (or manual) exposure control for controlling the amount of exposure in terms of an iris opening and a shutter speed. Subsequently, the levels of the R, G and B component signals are adjusted to effect white balance adjustment. At this instant, to achieve sufficient tonality with a color component lower in sensitivity than the other color components, high-frequency signal components are compressed and the dynamic range is provided with a margin to prevent the signal charges from saturating. The margin of the dynamic range thus provided, however, prevents the overall dynamic range from being efficiently available with the image sensor.

Moreover, the margin of the dynamic range makes it difficult to simply reduce the size of the individual photosensitive cells of the image sensor or to drive the cells with lower voltage. Consequently, noise generated in the cells cannot be reduced.

SUMMARY OF THE INVENTION

It is an object of the present invention to provide a solid-state image sensor capable of effectively using the charge storage capacity to the saturating extent, or dynamic range thereof, and reducing the size of the individual photosensitive cells as well as the noise of image signals, and an image pickup apparatus using the same.

A solid-state image sensor of the present invention includes a plurality of photoelectric transducing devices implemented by photosensitive cells arranged bidimensionally in the form of pixels while being shifted from each other to generate charges corresponding to the amounts of light incident thereto. A plurality of color filter segments are fitted on an array of the photosensitive cells for separating incident light into a first, a second and a third color component. A plurality of first vertical transfer paths vertically transfer the charges of the first color component generated by, among the photoelectric transducing devices, first photoelectric transducing devices provided with the color filter segments of the first color and shifted via respective transfer gates. A plurality of second vertical transfer paths for vertically transferring the charges of the second color generated by, among the photoelectric transducing devices, second photoelectric transducing devices provided with the color filter segments of the second color and shifted via respective transfer gates and the charges of the third color generated by third photoelectric transducing devices provided with the color filter segments of the third color via respective transfer gates. A first, a second, a third and a fourth vertical transfer electrode connect the first and second vertical transfer paths in the horizontal direction for causing the potential of the paths to vary in response to vertical drive pulses. A horizontal transfer path transfers in the horizontal scanning direction the charges of the first, second and third color components transferred on the first and second vertical transfer paths. An outputting device detects the charges transferred on the horizontal transfer path to output electric signals each corresponding to a particular one of the signal charges. The first and second vertical transfer paths alternate with each other in the horizontal direction. The first, second, third and fourth vertical transfer electrodes are sequentially connected to the first and second vertical transfer paths. The first photoelectric transducing devices are connected to the third vertical transfer electrode via the transfer gates for shifting the charges generated by the first photoelectric transducing devices to the first vertical transfer paths in synchronism with read pulses applied to the third vertical transfer electrode. The second photoelectric transducing devices are connected to the first vertical transfer electrode via the transfer gates for shifting the charges generated by the second photoelectric transducing devices to regions of the second vertical transfer paths corresponding to the first vertical transfer electrode in synchronism with read pulses applied to the first vertical transfer electrode. The third photoelectric transducing devices are connected to the second vertical transfer electrode via the transfer gates for shifting the charges generated by the third photoelectric transducing devices to regions of the second vertical transfer paths corresponding to the second vertical transfer electrode in synchronism with read pulses applied to the second vertical transfer electrode.

An image pickup apparatus using the image sensor described above is also provided.

BRIEF DESCRIPTION OF THE DRAWINGS

The objects and features of the present invention will become more apparent from consideration of the following detailed description taken in conjunction with the accompanying drawings in which:

FIG. 5 shows a specific relation between the color temperature of a scene and the transmissivity of color filter segments; and FIG. 6 is a timing chart useful for understanding another specific operation of the digital camera.

DESCRIPTION OF THE PREFERRED EMBODIMENT

Figure 2:
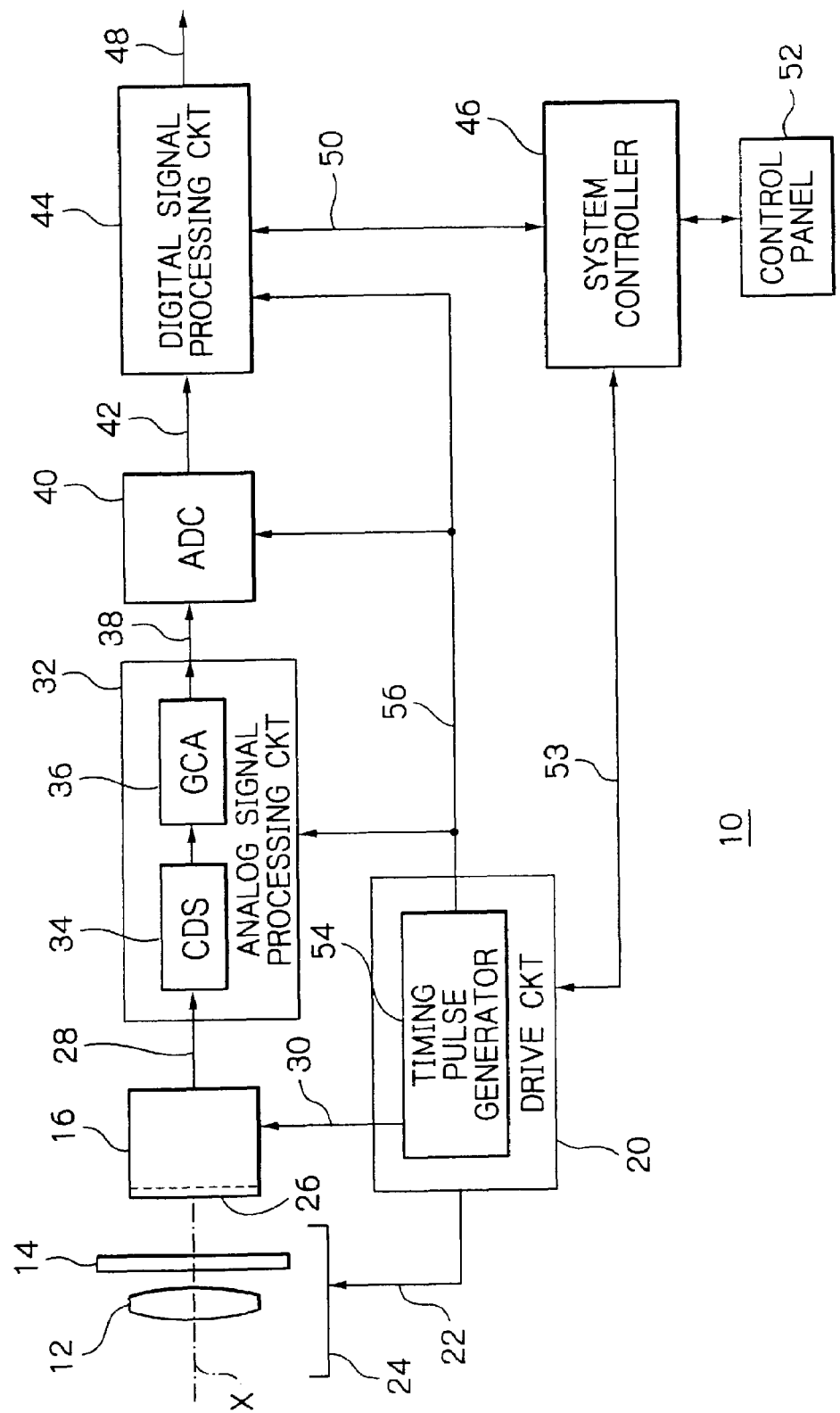
FIG. 2 is a schematic block diagram showing a digital camera including the image sensor shown in FIG. 1.

Referring to FIG. 2 of the accompanying drawings, an image pickup apparatus embodying the present invention is implemented as a digital camera by way of example. As shown, the digital camera, generally 10, includes an image pickup lens 12, a mechanical shutter 14 and a solid-state image sensor 16 sequentially arranged on an optical axis X in this order. An optical image captured from a scene is focused by the lens 12 on the array of photosensitive cells, not shown in FIG. 2, of the image sensor 16, and thereby converted to a moving picture or a still picture signal representative of the optical image. It is to be noted that part of the digital camera 10 not directly relevant to the understanding of the present invention is neither shown nor will be described. Signals appearing in the digital camera 10 are designated by reference numerals attached to connections on which they appear.

The camera 10 includes a drive circuit 20, which feeds drive signals to a drive mechanism 24 on a connect line 22, which will later be described in detail. The drive mechanism 24 selectively moves the lens 12 forward or backward on the optical axis X and selectively opens or closes the mechanical shutter 14 in response to the drive signals. In the illustrative embodiment, the aperture of the mechanical shutter 14 is variable for controlling the quantity of light to be incident to the image sensor 16, i.e. the shutter 14 has an iris function.

On the photosensitive cell array, not shown in FIG. 2, of the image sensor 16, a color filter 26 with a preselected color pattern is mounted. The image sensor 16 is a bidimensional image sensor configured to output color image signals representative of the scene on its output 28. More specifically, filter segments of three primary colors, i.e. R, G and B, are arranged on the photosensitive cell array of the image sensor 16 on a pixel-by-pixel basis, as will be described in detail later. Of course, the primary-color filter segments may be replaced with complementary-color filter segments, if desired. The drive circuit 20 feeds drive signals including a plurality of timing signals to the input 30 of the image sensor 16, so that the image sensor 16 produces signals corresponding to the quantities of light incident to the individual pixels on the output 28. The image sensor 16 has its output 28 connected to an analog signal processing circuit 32.

Figure 1:
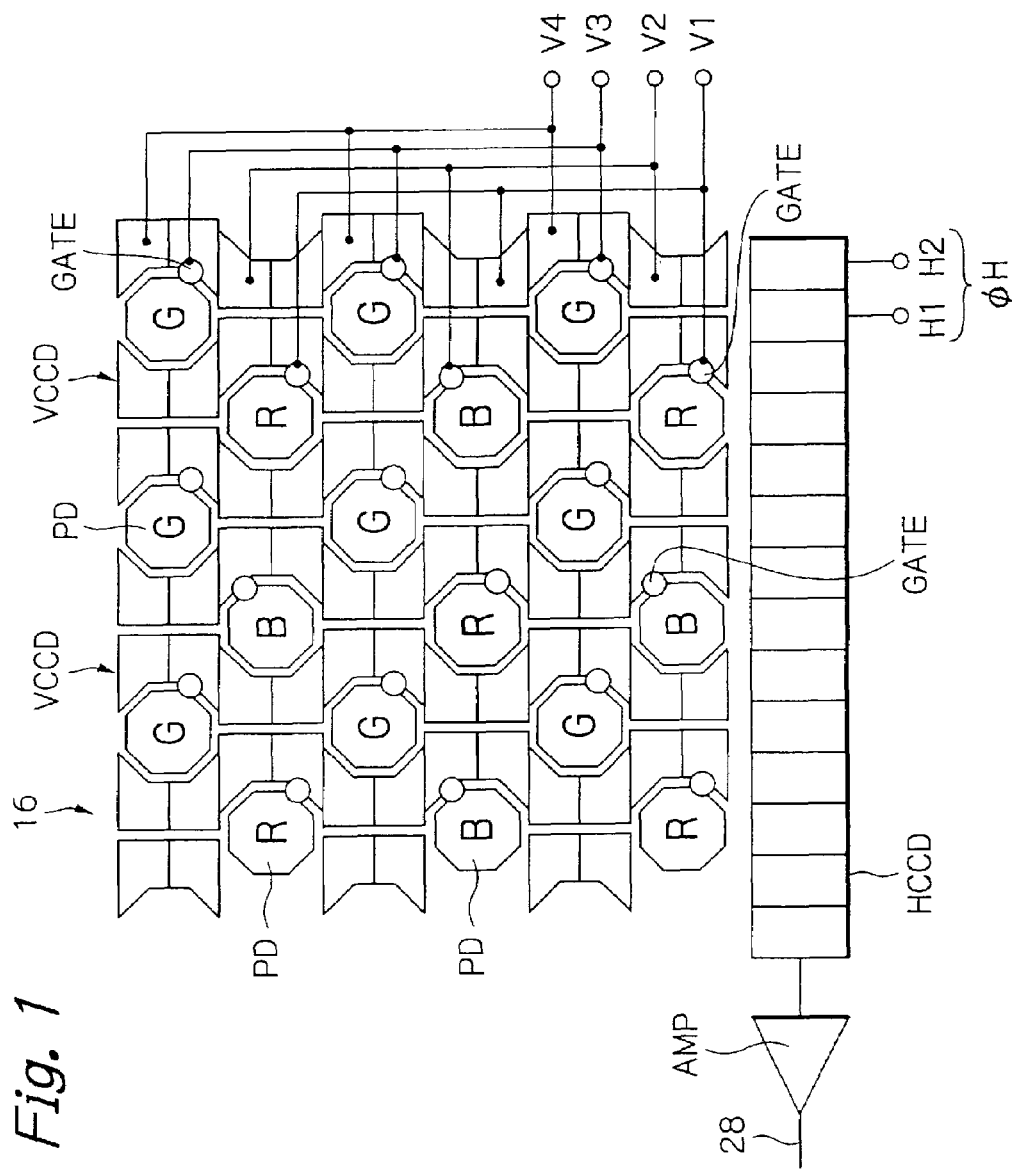
FIG. 1 is a plan view schematically showing the structure of a solid-state image sensor embodying the present invention.

FIG. 1 exemplarily shows part of the image sensor 16 in detail. As shown, the image sensor 16 has pixels arranged between nearby vertical transfer paths VCCD in a so-called honeycomb pattern. R, G and B filter segments are positioned on photodiodes or photoelectric transducers PD, which are arranged in a honeycomb pattern, in a so-called G-square, RB-full-checker pattern. More specifically, the photodiodes PD on each horizontal line are shifted from the photodiodes on nearby horizontal lines by one-half of the pitch of the actual pixels in a checker pattern. The vertical transfer paths VCCD each vertically extend zigzag between the photodiodes PD adjoining each other. A transfer gate GATE is positioned between each photodiode PD and one vertical transfer path VCCD associated therewith. While the individual photodiode PD is shown as being hexagonal, it should only be at least square or may even be circular, if desired.

Four vertical transfer electrodes V1 through V4 are connected to each vertical transfer path VCCD, forming four different regions, i.e. implementing a four-electrode structure for each photodiode PD. FIG. 1 shows only part of the vertical transfer paths VCCD for the sake of simplicity. The four electrodes connect the vertical transfer paths VCCD in the horizontal direction region by region.

In the illustrative embodiment, the transfer gates GATE assigned to the R photodiodes (R pixels) PD are connected to the vertical transfer electrode V1 of the vertical transfer paths VCCD. The transfer gates GATE assigned to the G photodiodes (G pixels) PD are connected to the vertical transfer electrode V3 of the vertical transfer paths VCCD. Likewise, the transfer gates GATE assigned to the B photodiodes (B pixels) PD are connected to the vertical transfer electrode V2. In this manner, the transfer gates GATE assigned to each color are connected to one of the vertical transfer electrodes to which a particular vertical drive pulse is input. In the illustrative embodiment, vertical drive pulses V1 through V4 are fed to the vertical transfer electrodes V1 through V4, respectively.

In the configuration shown in FIG. 1, the drive circuit 20, FIG. 2, feeds shift pulses, or PD read pulses, to the vertical transfer electrodes assigned to each color at a particular timing. In response, signal charges stored in the photodiodes PD from the storage start time are shifted to the vertical transfer paths VCCD via the transfer gates GATE in accordance with the color-by-color exposure time. At this instant, the regions corresponding to the electrode V4 form barriers, or shallow potential wells, to thereby prevent the shifted signal charges derived from different colors from being mixed together on the vertical transfer paths VCCD. In the illustrative embodiment, the first, third and second vertical transfer electrodes V1, V3 and V2 are assigned to the first, second and third color components R, G and B, respectively.

The G photodiode PD each are connected to the first region of a particular vertical transfer path VCCD adjoining the photodiode PD via the transfer gate GATE. None of the R, G and B transfer gates GATE is connected to the second regions adjoining the first regions. When signal charges are transferred from the photodiodes PD to the vertical transfer path VCCD associated therewith, a drive pulse fed to the vertical transfer electrode V4 causes each second region to form a barrier of high potential. The R and B photodiodes PD are respectively connected to the third regions and fourth regions, which sandwich the first regions and second regions, of the vertical transfer paths VCCD other than the above particular vertical transfer paths via respective transfer gates GATE.

When the signal charges are transferred from respective vertical transfer paths VCCD to the a horizontal transfer path HCCD, the signal charges are transferred from the horizontal transfer path HCCD driven by horizontal drive pulses φH (H1, H2) to an output amplifier AMP at high speed. The output amplifier AMP detects the signal charges having moved to the tail end of the horizontal transfer path HCCD. The output amplifier AMP converts the signal charges to electric image signals, outputting the image signals on its output 28.

FIG. 5 shows a table listing the transmissivity of the R, G and B filter segments constituting the color filter 26, which is included in the image sensor 16. The transmissivity was measured by picking up an achromatic subject while illuminating it with light sources each having particular color temperature. In FIG. 5, differences in transmissivity, i.e. photosensitivity derived from spectral characteristics between the R, G and B filter segments are represented by relative values with the G filter segment used as a reference. As shown, assuming that the G filter segment has a reference value of 1, then as for color temperature of 3,200 K the R and B filter segments have values of 1.5 to 1.8 and of 0.3 to 0.4, respectively. As for color temperature of 6,000 K, the R and B filter segments both have a value of about 0.7. Further, as for color temperature of 10,000 K, the R and B filter segments have values of 0.3 to 0.4 and 1.5 to 1.8, respectively.

As stated above, the R, G and B filter segments each have particular transmissivity and have therefore particular sensitivity in accordance with the color temperature of incident light. Consequently, the amount of exposure that causes a signal charge to saturate in the individual photodiode PD differs from one color to another in dependence upon the color temperature of a scene being picked up. In light of this, at the time of pickup, the illustrative embodiment corrects the difference in sensitivity color by color when determining an amount of exposure and thereby substantially uniformalizes the sensitivity of the image sensor 16 to the R, G and B components.

Referring again to FIG. 2, the analog signal processing circuit 32 connected to the output 28 of the image sensor 16 is made up of a correlated double sampling (CDS) circuit 34 and a gain-controlled amplifier (GCA) 36 connected as illustrated. The correlated double sampling circuit 34 is adapted to perform correlated double sampling with the image signals input to the analog signal processing circuit 32. The gain-controlled amplifier 36 is adapted to amplify the output of the correlated double sampling circuit 34 with a variable gain. More specifically, the gain-controlled amplifier 36 amplifies the R, G and B image signals input thereto with the same gain, which is controlled by a system controller 46 to be described later, thereby controlling the sensitivity of the entire camera 10. The gain-controlled amplifier 36, i.e. the analog signal processing circuit 32, has an output 38 connected to an analog-to-digital converter (ADC) 40.

The analog-to-digital converter 40 is adapted for converting the image signals appearing on its input 38 to digital image signals having, e.g. ten bits to fourteen bits each. The analog-to-digital converter 40 has its output 42 connected to a digital signal processing circuit 44.

The digital signal processing circuit 44 is adapted to execute various kinds of processing with the digital image signals input thereto and produce the resulting image signals on an output 48. In the illustrative embodiment, the processing circuit 44 executes gamma correction for correcting the tonality of the image signals by arithmetic operation. Also, the processing circuit 44 generates, by interpolation, R, G and B pixels output from the photodiodes PD of the image sensor 16 at the pixel positions, produces the values of virtual pixels intervening between the actual pixels from the values of surrounding pixels, and thins the pixels to one-fourth in the horizontal scanning direction to generate image data in a desired picture size. Further, the processing circuit 44 converts the R, G and B image signals to YC image signals made up of a luminance signal Y and color-difference signals C and produces the YC image signals on the output 48. The YC image signals are represented by eight bits by way of example.

In the event of preliminary pickup preceding actual pickup, the digital signal processing circuit 44 calculates estimated contrast values for focus control. More specifically, while the lens 12 is sequentially moved through a plurality of positions, the processing circuit 44 separates high-frequency components from image signals picked up at the respective positions which the lens 12 took. At this instant, the processing circuit 44 divides image data of a single picture into a plurality of blocks and performs estimation by use of an estimation pattern that weights each block with a particular weight. The processing circuit 44 produces the resulting values on an output 50 as estimated contrast values block by block. The output 50 is connected to the system controller 46.

Furthermore, during preliminary pickup, the digital signal processing circuit 44 produces from the image signals values that determine pickup conditions for actual pickup. For this purpose, the processing circuit 44 performs photometry for determining the lightness of the scene on the basis of the levels of the image signals output during preliminary pickup. Subsequently, the processing circuit 44 calculates estimated photometric values for determining an exposure time for actual pickup color by color.

More specifically, the digital signal processing circuit 44 measures the signal levels of the R, G and B image signals as estimated values representative of the luminance level of the scene. In the illustrative embodiment, the area of a single picture or image frame is divided into a plurality of regions, e.g. sixty-four blocks, so that the processing circuit 44 uses a photometry estimation pattern that weights preselected regions to calculate the estimated photometric values (R, G and B) of the individual blocks. Subsequently, the processing circuit 44 determines, based on a ratio between the estimated photometric values of the R, G and B image signals, a ratio between exposure times (R, G and B) that uniforms the levels of the R, G and B image signals.

To determine the ratio between the R, G and B exposure times, the processing circuit 44 may mix the individual color components of the blocks to estimate the color temperature of a light source present in the scene, and use the estimated color temperature and the spectral sensitivity ratio shown in FIG. 5. The R, G and B estimated photometric values and exposure time ratio are produced on the output 50 of the processing circuit 44. Alternatively, the exposure time ratio may be calculated by the system controller 46. In the illustrative embodiment, among the R, G and B estimated photometric values, the photometric value of the color component derived the largest amount of exposure is assumed to be unity. In this manner, preliminary pickup preceding actual pickup includes a movie mode for obtaining a moving picture signal and pickup for AF (Automatic Focus) and AE (Automatic Exposure) controls, and other adjustments.

The output 48 of the digital signal processing circuit 44 maybe connected to, e.g. an image display unit for displaying the processed image, a communication terminal for transmitting the image signals to another terminal, a recorder for recording the image signals in a data recording medium or a printer for printing the image, although not shown specifically. The processing circuit 44 is configured to match the format of the image signals to a data format particular to such an apparatus connected thereto.

The system controller 46 connected to the other output 50 of the digital signal processing circuit 44 is adapted to control the operation of the entire camera 10 with a microcomputer, peripheral circuitry and a control program not shown. The system controller 56 generates control signals in accordance with various commands and settings received from a control panel 52. The control panel 52 includes a shutter release switch, a dial switch for allowing the operator of the camera 10 to select desired modes, and a plurality of push-button switches for allowing the operator to select and set desired functions, although not shown specifically. The control panel 52 sends out information corresponding to the operator's manipulation to the system controller 46. The control panel 52 additionally includes a display panel for displaying the current manipulation condition and the status of the camera 10.

The system controller 46 generates particular control signals for each of preliminary and actual pickups in a still picture mode and delivers the control signals to the drive circuit 20 via its output 53.

During preliminary pickup, the system controller 46 generates control signals designating the movie mode in which the image sensor 16 is driven in the one-fourth thinning mode in the vertical direction. In this mode, the image sensor 16 outputs a moving picture signal representative of fifteen to thirty consecutive frames for a second. A moving picture represented by the moving picture signal may be displayed on a monitor, not shown, mounted on the camera 10.

In the event of actual pickup, the system controller 46 generates control signals designating the still picture mode in which the image sensor 16 outputs a still picture signal representative of a single frame in response to shutter release information fed from the control panel 52. In the illustrative embodiment, in the still picture mode, the system controller 46 controls the drive circuit 20 in a progressive scanning mode for reading out all pixels.

In the still picture mode, if the operator has selected the function of automatically determining shooting conditions for the AE and AF modes, then the shooting conditions can be determined in accordance with the various estimation values produced during preliminary pickup. As for the AE mode, for example, the system controller 46 determines exposure values, which are an iris opening and a shutter speed, color by color in accordance with the estimated photometric values fed from the digital signal processing circuit 44. As for the AF mode, the system controller 46 generates, based on the estimated contrast values, AF control signals for so controlling the position of the lens 12 as to focus the camera 10 on a desired subject.

More specifically, in the AE mode, if the estimated R, G and B photometric values are 0.5, 1 and 0.5, respectively, then the system controller 46 produces an exposure time ratio of R:G:B=2t:t:2t, which are the reciprocals of the photometric values, and generates control signals assigning the exposure time of 2t double the exposure time of the G component to each of R and B components. If the R, G and B estimated photometric values are 0.25, 0.5 and 1, respectively, then the system controller 46 produces an exposure time ratio of R:G:B=4t:2t:t. In this case, the system controller 46 generates control signals assigning an exposure time quadruple the exposure time of the B component to the R component and assigning an exposure time double the exposure time of the B component to the G component.

As stated above, the system controller 46 calculates, based on the R, G and B estimated photometric values, an exposure time ratio (R:G:B) that uniforms the levels of the R, G and B image signals, thereby assigning a particular exposure time to each of the R, G and B components. The system controller 46 then delivers control signals including information representative of the color-by-color exposure times to the drive circuit 20. Alternatively, the system controller 46 may produce an estimated photometric value from the luminance signal Y and then determine color-by-color exposure times on the basis of the estimated photometric value and the balance of the R, G and B components. Further, the digital signal processing circuit 44 may be configured to determine the color temperature of image signals, in which case the system controller 46 will determine color-by-color exposure times in accordance with the transmissivity of the filter segments corresponding to the color temperature.

At the time when the digital signal processing circuit 44 produces the processed image signal on the output 48, the system controller 46 delivers the exposure information to the processing circuit 44. The exposure information therefore appears on the output 48 together with the image signal.

To control the exposure time color by color, as stated above, the drive circuit 20 switches the drive of the image sensor 26. More specifically, the drive circuit 20 generates drive signals 22 for driving the drive mechanism 24 in accordance with the control signals received from the system controller 45 via its input 53. The drive signals 22 include a drive signal for shifting the lens 12 and a drive signal for opening or closing the mechanical shutter 14 by an adequate amount. The drive circuit 20 includes a timing pulse generator 54 configured to generate various timing signals including a vertical synchronizing signal VD. The timing signal generator 54 outputs drive signals 30 for driving the image sensor 16 and timing signals 56 including a pixel clock and a reference clock as well as the vertical synchronizing signal VD. The timing signals 56 are delivered to the analog signal processing circuit 32, analog-to-digital converter 40, and digital signal processing circuit 44.

Figure 3:
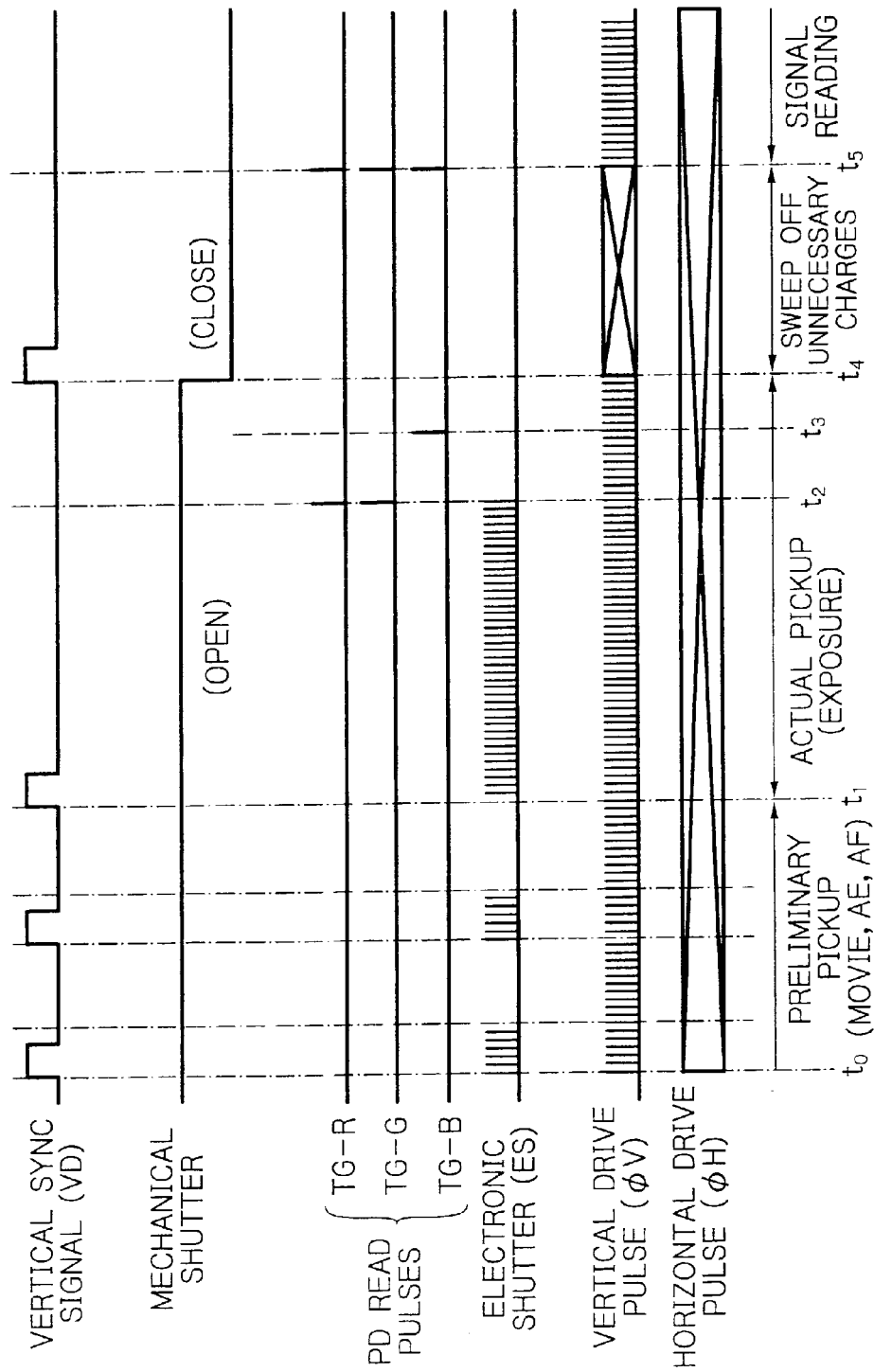
FIG. 3 is a timing chart useful for understanding a specific operation of the digital camera of FIG. 2.

FIG. 3 shows specific drive signals 30 output from the drive circuit 20. As shown, the drive control signals 30 include R, G and B PD (photodiode) read pulses TG-R, TG-G and TG-B, electronic shutter pulses ES, vertical drive pulses φV, and horizontal drive pulses φH. In FIG. 2, a plurality of connections for transferring the drive control signals 30 are represented by a single solid line. The PD read pulses TG-R, TG-G and TG-B cause signal charges generated by the R, G and B photodiodes PD, FIG. 1, to be shifted to the vertical transfer paths VCCD via the associated transfer gates GATE.

The electronic shutter pulses ES and PD read pulses TG-R, TG-G and TG-B each are generated at a particular timing in accordance with the exposure information, i.e. color-by-color exposure time set by the system controller 46. As shown in FIG. 3, as for the PD read pulses TG-R, when the electronic shutter pulses ES stop being output at a time t2, unnecessary charges are fully discharged from the photodiodes PD. At the same time, the first PD read pulse TG-R corresponding to the R exposure time is generated to discharge unnecessary charges from the R photodiodes PD-R to the vertical transfer paths VCCD. At a time t5, the second PD read pulse TG-R is generated to transfer signal charges accumulated in the R photodiodes PD-R up to the time t5 to the vertical transfer paths VCCD. After the time t5, the signal charges produced from the photodiodes PD-R or R pixels are transferred from the vertical transfer paths VCCD to the horizontal transfer path HCCD (see FIG. 1). In the specific timing chart of FIG. 3, the PD read pulses TG-G are generated at the same timing as the PD read pulses TG-R. As for the PD read pulse TG-B, unnecessary charges are discharged from the B photodiodes PD at a time t3. At this time, actual exposure for actual pickup begins.

At a time t4, the mechanical shutter 14 is closed to intercept light to be incident to the surfaces of the photodiodes PD, thereby ending exposure. During the interval between the times t4 and t5, the timing pulse generator 54 generates vertical and horizontal drive pulses for sweeping the vertical transfer paths VCCD and horizontal transfer path HCCD at high speed, so that unnecessary charges on the paths VCCD and HCCD are discarded. At the time t5, the second PD read pulses TG-R, TG-G and TG-B are generated for shifting signal charges stored in the photodiodes PD during the color-by-color exposure times to the vertical transfer paths VCCD via the transfer gates GATE.

Figure 4:
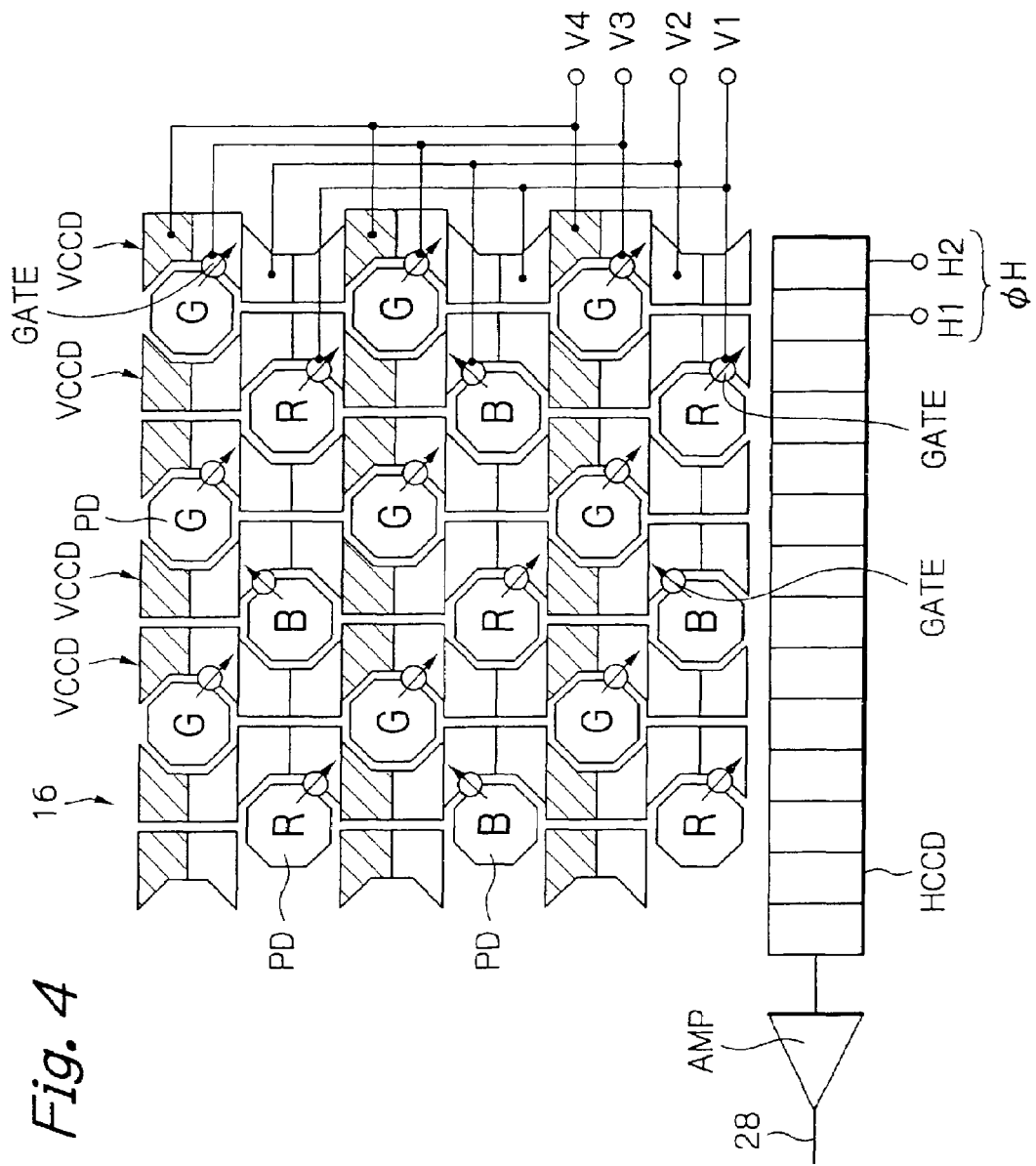
FIG. 4 demonstrates how the signal charges are shifted from photodiodes to vertical transfer paths and the barriers are formed specifically to the image sensor of FIG. 1.

FIG. 4 demonstrates how the signal charges are shifted from the photodiodes PD to the vertical transfer paths VCCD in response to the second PD read pulses TG-R, TG-G and TG-B. As shown, the regions of the vertical transfer paths VCCD connected to the vertical transfer electrode V4 (indicated with hatching) form barriers and isolate each pixel from the other pixels adjoining it in the up-and-down direction.

As stated above, by using the image sensor 16 shown in FIG. 1, it is possible to variably control the shift timing of unnecessary charges from the photodiodes PD to the vertical transfer paths VCCD color by color for thereby assigning a particular shift timing of signal charges from the photodiodes PD to the paths VCCD to each color. This allows exposure to be effected color by color.

In the illustrative embodiment, to uniform the levels of the image signals of different colors, an exposure time selected for the color component having a large estimated photometric value and provided with the shortest set exposure time is used as a reference exposure time. Exposure times for the other color components are made longer than the reference exposure time in accordance with the exposure time ratio. Alternatively, an exposure time selected for the color component having a longer exposure time than the other color components may be used as a reference exposure time, in which case exposure times for the other color components will be made shorter than the reference exposure time. In any case, as for, e.g. a highlight portion included in an image, the photodiodes PD can generate amounts of charges substantially identical in signal charge level.

By using the electronic shutter pulses ES in addition to the other drive pulses, the illustrative embodiment discards unnecessary charges to a circuit board, not shown, via overflow drains (OFD) to thereby reduce a sweep time for sweeping off unnecessary charges. Alternatively, if a period of time long enough for unnecessary charges to be swept out via the vertical and horizontal transfer paths is available at the time of transition from preliminary pickup to actual pickup, then unnecessary charges may be shifted from the photodiodes PD to the vertical transfer paths VCCD by the first PD read pulses TG-R, TG-G and TG-B. This makes it needless to use the electronic shutter pulses ES.

The electronic shutter pulses ES can sufficiently discharge unnecessary charges. Therefore, the PD read pulses TG-R and TG-G output for the first time at the end of the electronic shutter pulses ES, as shown in FIG. 3 specifically, may not be output.

A specific operation of the digital camera 10 will be described with reference to FIG. 3. The operator selects the AE and AF modes on the camera 10, so that the camera 10 is driven in the movie mode. As shown in FIG. 3, the mechanical shutter 14 is left open from the beginning of movie mode operation to a time t4 at which exposure ends.

Preliminary pickup is effected from a time t0 to a time t1 for driving the image sensor 16 in a thinning mode, so that image signals reduced in the number of pixels to one-fourth in the vertical direction are generated every scanning period. More specifically, during preliminary pickup, the electronic shutter pulses ES, vertical drive pulses $\phi$V and horizontal drive pulses $\phi$H are fed to the image sensor 16 in synchronism with the vertical synchronizing signal VD. As a result, signal charges generated in the photodiodes PD are sequentially transferred to the horizontal transfer path HCCD via the vertical transfer paths VCCD. The image sensor 16 therefore outputs image signals each having a voltage corresponding to a particular signal charge pixel by pixel.

The digital signal processing circuit 44 outputs various estimated values for adjustment stated earlier on the basis of the image signals output by the preliminary pickup or movie mode operation. More specifically, up to the time t1, the processing circuit 44 produces estimated photometric values and estimated contrast values from the consecutive frames of a moving picture signal. At the same time, the moving picture signal is delivered to, e.g. the monitor of the camera 10.

When the shutter release switch included in the control panel 52 is turned on at the time t1, the resulting information is sent out from the control panel 52 to the system controller 46. In response, the system controller 46 sets up the still picture mode and causes the electronic shutter pulses ES to be fed to the image sensor 16. The pulses ES sweep out charges generated by the photodiodes PD to the circuit board up to the beginning of exposure.

Assume that the R, G and B estimated photometric values derived from the image signals output by preliminary pickup are 0.5, 1 and 0.5, respectively, and therefore the exposure time ratio R:G:B is 2t:t:2t. Then, the PD read pulses TG-R and TG-G are output at the time t2 and fed from the drive circuit 20 to the image sensor 16. Subsequently, at the time t3, the PD read pulses TG-B is generated and fed from the drive circuit 20 to the image sensor 16. Consequently, signal charges are shifted via the transfer gates GATE color by color. At the time T4 when the exposure for all of the color components R, G and B ends, the mechanical shutter 14 is closed.

During the interval between the times t4 and t5, unnecessary charges remaining on the vertical transfer paths VCCD and horizontal transfer path HCCD are swept out while signal charges generated in the photodiodes PD are held therein. At this instant, as shown in FIG. 4, the potential of the vertical transfer electrode V4 is so controlled as to form barriers on the vertical transfer paths VCCD, as stated earlier. At the same time, signal charges generated in the photodiodes PD are transferred to the vertical transfer paths VCCD via the transfer gates GATE due to the potential of the vertical drive pulses, as indicated by arrows in FIG. 4. More specifically, the regions that form barriers are sequentially shifted toward the horizontal transfer path HCCD, thereby shifting the signal charges to the path HCCD. At this time, while deep potential wells are formed in the vertical transfer paths VCCD connected to the other electrodes and hold the signal charges, two-phase or three-phase vertical drive pulses should only be applied to three electrodes.

At the time t5 when the sweeping operation ends, the second PD read pulses TG-R, TG-G and TG-B are output to transfer signal charges stored in the photodiodes PD to the vertical transfer paths VCCD. These signal charges are sequentially vertically transferred to the horizontal transfer path HCCD by the vertical drive pulses φV. Subsequently, the signal charges are transferred along the horizontal transfer path HCCD to the output amplifier AMP by the horizontal drive pulses φH. The output amplifier AMP converts the consecutive signal charges input from the horizontal transfer path HCCD to electric image signals while producing the image signals on its output 28. The image signals so read out of the image sensor 16 are input to the analog signal processing circuit 32.

In the analog signal processing circuit 32, the correlated double sampling circuit 34 executes correlated double sampling with the consecutive image signals to thereby remove noise components. Subsequently, the gain-controlled amplifier 36 amplifies the image signals with the same gain. The analog-to-digital converter 40 converts the analog image signals output from the analog signal processing circuit 32 to digital image signals while delivering the digital image signals to the digital signal processing circuit 44.

The digital signal processing circuit 44 executes processing for pixel generation, various kinds of correction and adjustment. In the illustrative embodiment, the R, G and B image signals each are picked up over a particular exposure time matching with an estimated photometric value, so that such color components have the same level. This makes it needless for the processing circuit 44 to adjust white balance by calculating signal levels one by one, thereby obviating quantization errors ascribable to calculations.

When the image signals should be recorded in a memory card including a semiconductor memory or similar data storing medium, the image signals are converted to YC image signals and then coded by compression. In this case, the digital signal processing circuit 44 produces the exposure information fed from the system controller 46 and the coded image signals on the output 48. The exposure information and coded image signals are written to the preselected area of the data recording medium.

Assume that the R, G and B estimated photometric values are 0.25, 0.5 and 1.0, respectively, and therefore the exposure time ratio R:G:G is 4t:2t:t. Then, as shown in FIG. 6, the PD read pulses TG-R, TG-G and TG-B are sequentially output at times t2, t3 and t4, respectively. Signal charges generated in the photodiodes PD are transferred to the vertical transfer paths VCCD color by color in accordance with the PD read pulses TG-R, TG-G and TG-B. At a time t5, the mechanical shutter 14 is closed to end the actual exposure time. After unnecessary charges have been swept out over the interval between the time t5 and a time t6, the signal charges generated in the photodiodes PD are transferred to the vertical transfer paths VCCD.

As stated above, the illustrative embodiment matches, without regard to the color temperature of a light source used, the levels of the R, G and B signals read out of the image sensor 16 in accordance with the color-by-color photometric values and exposure time ratio. The illustrative embodiment therefore does not have to provide the image sensor 16 with the conventional broad dynamic range and can reduce the cell size. Further, the illustrative embodiment reduces the amount of charge to deal with and therefore required voltage. Moreover, the digital signal processing circuit 44 does not have to execute white balance adjustment with the image signals, so that the S/N (Signal-to-Noise) ratio is uniformed throughout the R, G and B image signals.

In summary, in accordance with the present invention, a solid-state image sensor includes photodiodes or similar photosensitive devices arranged bidimensionally and shifted from each other in the horizontal and vertical directions as to pixel position, so that signal charges can be read out on a color component basis. With a particular exposure time assigned to each color component, the image sensor can output R G and B image signals having the same signal level in the event of pickup. This frees signal processing circuitry from calculations for white balance adjustment and uniformalizes the noise components of the R, G and B image signals. Further, the image sensor can have the size of its cells to be reduced and can be driven by lower voltage.

The entire disclosure of Japanese patent application No. 2001-359726 filed on Nov. 26, 2001, including the specification, claims, accompanying drawings and abstract of the disclosure is incorporated herein by reference in its entirety.

While the present invention has been described with reference to the particular illustrative embodiment, it is not to be restricted by the embodiment. It is to be appreciated that those skilled in the art can change or modify the embodiment without departing from the scope and spirit of the present invention.

What is claimed is:

1. A solid-state image sensor comprising:
a plurality of photoelectric transducing devices comprising photosensitive cells arranged bidimensionally in vertical columns in a form of pixels while each column is being shifted from each other such that photosensitive cells from adjacent columns do not align horizontally to generate charges corresponding to amounts of light incident to the photosensitive cells, and a plurality of color filter segments fitted on an array of the photosensitive cells for separating incident light into a first, a second and a third color component;
a plurality of first vertical transfer paths for vertically transferring the charges of the first color component generated by, among said plurality of photoelectric transducing devices, first photoelectric transducing devices provided with said color filter segments of the first color and shifted via respective transfer gates;
a plurality of second vertical transfer paths for vertically transferring the charges of the second color generated by, among said plurality of photoelectric transducing devices, second photoelectric transducing devices provided with said color filter segments of the second color and shifted via respective transfer gates and the charges of the third color generated by third photoelectric transducing devices provided with said color filter segments of the third color via respective transfer gates;
a first, a second, a third and a fourth vertical transfer electrode connecting said first vertical transfer paths and said second vertical transfer paths in a horizontal direction for causing potential of said first vertical transfer paths and said second vertical transfer paths to vary in response to vertical drive pulses;

a horizontal transfer path for transferring in a horizontal scanning direction the charges of the first color component, the second color component and the third color component transferred on said first vertical transfer paths and said second vertical transfer paths; and an outputting device for detecting the charges transferred on said horizontal transfer path to output electric signals each corresponding to a particular one of said signal charges;

said first vertical transfer paths and said second vertical transfer paths alternating with each other in the horizontal direction, and comprised of a plurality of sections where each photosensitive cell has associated therewith four sections positioned in two pairs on opposite sides of the photosensitive cell, where one section acts to shift charges from the photosensitive cell wherein each one of the four sections assigned to a photosensitive cell is connected to one of the first, second, third or fourth vertical transfer electrodes, where the sections connected to the fourth vertical transfer electrode form a barrier when activated by said vertical drive pulse, said first vertical transfer electrode, said second vertical transfer electrode, said third vertical transfer electrode and said fourth vertical transfer electrode being sequentially connected to said first vertical transfer paths and said second vertical paths, said first photoelectric transducing devices being connected to said third vertical transfer electrode via said transfer gates for shifting the charges generated by said first photoelectric transducing devices to said first vertical transfer paths in synchronism with read pulses applied to said third vertical transfer electrode, said second photoelectric transducing devices being connected to said first vertical transfer electrode via said transfer gates for shifting the charges generated by said second photoelectric transducing devices to regions of said second vertical transfer paths corresponding to said first vertical transfer electrode in synchronism with read pulses applied to said first vertical transfer electrode, said third photoelectric transducing devices being connected to said second vertical transfer electrode via said transfer gates for shifting the charges generated by said third photoelectric transducing devices to regions of said second vertical transfer paths corresponding to said second vertical transfer electrode in synchronism with read pulses applied to said second vertical transfer electrode.

2. The image sensor in accordance with claim 1, wherein the first color component, the second color component and the third color component comprise a green component, a red component and a blue component, respectively.

3. The image sensor in accordance with claim 1, wherein regions of said first vertical transfer paths and said second vertical transfer paths corresponding to said fourth vertical transfer electrode are not connected to said transfer gates and form barriers of shallow potential in response to pulses applied to said fourth vertical transfer electrode.

4. An image pickup apparatus for generating image signals representative of an optical image incident via an image pickup lens, comprising:

a solid-state image sensor for generating image signals representative of a color image corresponding to the optical image, which is incident to a photosensitive cell array of said solid-state image sensor;

an amplifier for amplifying the image signals;

an analog-to-digital converter for converting amplified image signals output from said amplifier to digital image signals;

a signal processor for processing the digital image signals, the signal processor measuring signal levels from a plurality of regions of said image, the signal levels used to obtain an estimated photometric value for each of a plurality of photosensitive cells and determines an exposure time for each photosensitive cell based on a ratio between the estimated photometric values of each photosensitive cell so as to provide an output signal for each photosensitive cell having the same luminance level;

drive circuit for driving said image sensor; and a controller for controlling an amount of exposure of said image sensor;

said image sensor comprising:

a plurality of photoelectric transducing devices comprising photosensitive cells arranged bidimensionally in vertical columns in a form of pixels while each column is being shifted from each other such that photosensitive cells from adjacent columns do not align horizontally to generate charges corresponding to amounts of light incident to the photosensitive cells, and a plurality of color filter segments fitted on an array of the photosensitive cells for separating incident light into a first, a second and a third color component;

a plurality of first vertical transfer paths for vertically transferring the charges of the first color component generated by, among said plurality of photoelectric transducing devices, first photoelectric transducing devices provided with said color filter segments of the first color and shifted via respective transfer gates;

a plurality of second vertical transfer paths for vertically transferring the charges of the second color generated by, among said plurality of photoelectric transducing devices, second photoelectric transducing devices provided with said color filter segments of the second color and shifted via respective transfer gates and the charges of the third color generated by third photoelectric transducing devices provided with said color filter segments of the third color via respective transfer gates;

a first, a second, a third and a fourth vertical transfer electrode connecting said first vertical transfer paths and said second vertical transfer paths in a horizontal direction for causing potential of said first vertical transfer paths and said second vertical transfer paths to vary in response to vertical drive pulses;

a horizontal transfer path for transferring in a horizontal scanning direction the charges of the first color component, the second color component and the third color component transferred on said first vertical transfer paths and said second vertical transfer paths; and an outputting device for detecting the charges transferred on said horizontal transfer path to output electric signals each corresponding to a particular one of said signal charges;

said first vertical transfer paths and said second vertical transfer paths alternating with each other in the horizontal direction, and comprised of a plurality of sections where each photosensitive cell has associated therewith four sections positioned in two pairs on opposite sides of the photosensitive cell, where one section acts to shift charges from the photosensitive cell wherein each one of the four sections assigned to a photosensitive cell is connected to one of the first, second, third or fourth vertical transfer electrodes, where the sections connected to the fourth vertical transfer electrode form a barrier when activated by said vertical drive pulse, said first vertical transfer electrode, said second vertical transfer electrode, said third vertical transfer electrode and said fourth vertical transfer electrode being sequentially connected to said first vertical transfer paths and said second vertical paths, said first photoelectric transducing devices being connected to said third vertical transfer electrode via said transfer gates for shifting the charges generated by said first photoelectric transducing devices to said first vertical transfer paths in synchronism with read pulses applied to said third vertical transfer electrode, said second photoelectric transducing devices being connected to said first vertical transfer electrode via said transfer gates for shifting the charges generated by said second photoelectric transducing devices to regions of said second vertical transfer paths corresponding to said first vertical transfer electrode in synchronism with read pulses applied to said first vertical transfer electrode, said third photoelectric transducing devices being connected to said second vertical transfer electrode via said transfer gates for shifting the charges generated by said third photoelectric transducing devices to regions of said second vertical transfer paths corresponding to said second vertical transfer electrode in synchronism with read pulses applied to said second vertical transfer electrode, said controller causing said drive circuit to feed said read pulses to said first vertical transfer electrode, said second vertical transfer electrode and said third vertical transfer electrode such that a particular exposure time is assigned to each of the first color component, the second color component and the third color component.

5. The apparatus in accordance with claim 4, wherein said drive circuit feeds first shift pulses to said vertical transfer electrodes for shifting unnecessary charges from said photoelectric transducing devices to said vertical transfer paths via said transfer gates to sweep out the unnecessary charges and then starts exposure, said control means controlling a timing for starting the exposure.

6. The apparatus in accordance with claim 5, when the signal charges generated in said photoelectric transducing devices are read out after the exposure, said drive circuit feeds second out shift pulses to said vertical transfer electrodes for shifting said signal charges to said vertical transfer paths.

7. The apparatus in accordance with claim 4, wherein said drive circuit feeds electronic shutter pulses to said image sensor for controlling a timing for starting exposure for any one of said first photoelectric transducing devices, said second photoelectric transducing devices and said third photoelectric transducing devices, any one of said first photoelectric transducing devices, said second photoelectric transducing devices and said third photoelectric transducing devices receiving said electronic shutter pulses discharging the charges generated therein to a circuit board via overflow drains.

8. The apparatus in accordance with claim 4, further comprising a mechanical shutter interposed between said image pickup lens and said image sensor for selectively intercepting light incident via said image pickup lens, wherein said controller causes said drive circuit to close said mechanical shutter to end exposure times of all of the first color component, the second color component and the third color component and then causes said drive circuit to sweep out unnecessary charges on said vertical transfer paths at a high speed.

9. The apparatus in accordance with claim 4, wherein said signal processor measures lightness of a scene being picked up on the basis of the image signals, said controller controlling an exposure time in a still picture mode on the basis of a photometric value output from said signal processor.

10. The apparatus in accordance with claim 9, wherein said signal processor calculates a particular photometric value with each of the first color component, the second color component and the third color component on the basis of the image signals, said controller controlling, based on color-by-color photometric values output from said signal processor, exposure times for said first photoelectric transducing devices, said second photoelectric transducing devices and said third photoelectric transducing devices.

11. The apparatus in accordance with claim 10, wherein said controller controls, based on the color-by-color photometric values, the exposure times such that the image signals are balanced in color.

12. The apparatus in accordance with claim 9, wherein when the lightness of the scene is measured, said drive circuit drives said image sensor in such a manner as to reduce a number of pixels in a vertical direction.

13. The apparatus in accordance with claim 4, wherein the first color component, the second color component and the third color component comprise a green component, a red component and a blue component, respectively.

14. The apparatus in accordance with claim 4, wherein said controller controls actual pickup, which picks up the scene in response to information representative of a shutter release command and generates still picture signals, and preliminary pickup, which calculates estimated values for determining pickup conditions for said actual pickup, and adjusts the exposure times in accordance with said estimated values in the event of said actual pickup.

15. The apparatus in accordance with claim 4, wherein said signal processor determines a color temperature of a light source illuminating the scene on the basis of the image signals, said controller controlling the exposure times in accordance with the color temperature determined.

16. The apparatus in accordance with claim 4, wherein said apparatus executes color balance adjustment in the event of exposure of said image sensor.

17. The apparatus in accordance with claim 4, wherein said controller causes said drive circuit in a still picture mode to feed the read pulses to said first, second and third vertical transfer electrodes to read out the charges from said plurality of photoelectric transducing devices.

18. A solid-state image sensor comprising:
a plurality of photoelectric transducing devices comprising photosensitive cells arranged bidimensionally in vertical columns in a form of pixels while each column is being shifted from each other such that photosensitive cells from adjacent columns do not align horizontally to generate charges corresponding to amounts of light incident to the photosensitive cells, and a plurality of color filter segments fitted on an array of the photosensitive cells for separating incident light into a first, a second and a third color component;
a plurality of first vertical transfer paths for vertically transferring the charges of only the first color component generated by, among said plurality of photoelectric transducing devices, first photoelectric transducing devices provided with said color filter segments of the first color and shifted via respective transfer gates;

a plurality of second vertical transfer paths for vertically transferring only the charges of the second color generated by, among said plurality of photoelectric transducing devices, second photoelectric transducing devices provided with said color filter segments of the second color and shifted via respective transfer gates and the charges of the third color generated by third photoelectric transducing devices provided with said color filter segments of the third color via respective transfer gates;

a first, a second, a third and a fourth vertical transfer electrode connecting said first vertical transfer paths and said second vertical transfer paths in a horizontal direction for causing potential of said first vertical transfer paths and said second vertical transfer paths to vary in response to vertical drive pulses; a horizontal transfer path for transferring in a horizontal scanning direction the charges of the first color component, the second color component and the third color component transferred on said first vertical transfer paths and said second vertical transfer paths; and an outputting device for detecting the charges transferred on said horizontal transfer path to output electric signals each corresponding to a particular one of said signal charges;

said first vertical transfer paths and said second vertical transfer paths alternating with each other in the horizontal direction, and comprised of a plurality of sections where each photosensitive cell has four sections positioned in two pairs on opposite sides of the photosensitive cell, where one section acts to shift charges from the photosensitive cell, said first vertical transfer electrode, said second vertical transfer electrode, said third vertical transfer electrode and said fourth vertical transfer electrode being sequentially connected to said first vertical transfer paths and said second vertical paths, said first photoelectric transducing devices being connected to said third vertical transfer electrode via said transfer gates for shifting the charges generated by said first photoelectric transducing devices to said first vertical transfer paths in synchronism with read pulses applied to said third vertical transfer electrode, said second photoelectric transducing devices being connected to said first vertical transfer electrode via said transfer gates for shifting the charges generated by said second photoelectric transducing devices to regions of said second vertical transfer paths corresponding to said first vertical transfer electrode in synchronism with read pulses applied to said first vertical transfer electrode, said third photoelectric transducing devices being connected to said second vertical transfer electrode via said transfer gates for shifting the charges generated by said third photoelectric transducing device sto regions of said second vertical transfer paths corresponding to said second vertical transfer electrode in synchronism with read pulses applied to said second vertical transfer electrode.

19. An image pickup apparatus for generating image signals representative of an optical image incident via an image pickup lens, comprising:

a solid-state image sensor for generating image signals representative of a color image corresponding to the optical image, which is incident to a photosensitive cell array of said solid-state image sensor;

an amplifier for amplifying the image signals;

an analog-to-digital converter for converting amplified image signals output from said amplifier to digital image signals;

a signal processor for processing the digital image signals, the signal processor measuring signal levels from a plurality of regions of said image, the signal levels used to obtain an estimated photometric value for each of a plurality of photosensitive cells and determining an exposure time for each photosensitive cell based on a ratio between the estimated photometric values of each photosensitive cell so as to provide an output signal from each photosensitive cell having the same luminance level;

a drive circuit for driving said image sensor; and a controller for controlling an amount of exposure of said image sensor;

said image sensor comprising:

a plurality of photoelectric transducing devices comprising photosensitive cells arranged bidimensionally in vertical columns in a form of pixels while each column is being shifted from each other such that photosensitive cells from adjacent columns do not align horizontally to generate charges corresponding to amounts of light incident to the photosensitive cells, and a plurality of color filter segments fitted on an array of the photosensitive cells for separating incident light into a first, a second and a third color component;

a plurality of first vertical transfer paths for vertically transferring the charges only of the first color component generated by, among said plurality of photoelectric transducing devices, first photoelectric transducing devices provided with said color filter segments of the first color and shifted via respective transfer gates;

a plurality of second vertical transfer paths for vertically transferring only the charges of the second color generated by, among said plurality of photoelectric transducing devices, second photoelectric transducing devices provided with said color filter segments of the second color and shifted via respective transfer gates and the charges of the third color generated by third photoelectric transducing devices provided with said color filter segments of the third color via respective transfer gates;

a first, a second, a third and a fourth vertical transfer electrode connecting said first vertical transfer paths and said second vertical transfer paths in a horizontal direction for causing potential of said first vertical transfer paths and said second vertical transfer paths to vary in response to vertical drive pulses;

a horizontal transfer path for transferring in a horizontal scanning direction the charges of the first color component, the second color component and the third color component transferred on said first vertical transfer paths and said second vertical transfer paths; and an outputting device for detecting the charges transferred on said horizontal transfer path to output electric signals each corresponding to a particular one of said signal charges;

said first vertical transfer paths and said second vertical transfer paths alternating with each other in the horizontal direction, said first vertical transfer electrode, said second vertical transfer electrode, said third vertical transfer electrode and said fourth vertical transfer electrode being sequentially connected to said first vertical transfer paths and said second vertical paths, said first photoelectric transducing devices being connected to said third vertical transfer electrode via said transfer gates for shifting the charges generated by said first photoelectric transducing devices to said first vertical transfer paths in synchronism with read pulses applied to said third vertical transfer electrode, said second photoelectric transducing devices being connected to said first vertical transfer electrode via said transfer gates for shifting the charges generated by said second photoelectric transducing devices to regions of said second vertical transfer paths corresponding to said first vertical transfer electrode in synchronism with read pulses applied to said first vertical transfer electrode, said third photoelectric transducing devices being connected to said second vertical transfer electrode via said transfer gates for shifting the charges generated by said third photoelectric transducing devices to regions of said second vertical transfer paths corresponding to said second vertical transfer electrode in synchronism with read pulses applied to said second vertical transfer electrode, said controller causing said drive circuit to feed said read pulses to said first vertical transfer electrode, said second vertical transfer electrode and said third vertical transfer electrode such that a particular exposure time is assigned to each of the first color component, the second color component and the third color component.

* * * * *